United States Patent
Wei et al.

(10) Patent No.: US 9,876,424 B2
(45) Date of Patent: Jan. 23, 2018

(54) COMPENSATION NETWORK, SWITCHING POWER SUPPLY CIRCUIT AND CIRCUIT COMPENSATION METHOD

(71) Applicant: SANECHIPS TECHNOLOGY CO., LTD., Guangdong (CN)

(72) Inventors: Dong Wei, Guangdong (CN); Weisheng Geng, Guangdong (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/311,371

(22) PCT Filed: Sep. 22, 2014

(86) PCT No.: PCT/CN2014/087132
§ 371 (c)(1),
(2) Date: Nov. 15, 2016

(87) PCT Pub. No.: WO2015/172495
PCT Pub. Date: Nov. 19, 2015

(65) Prior Publication Data
US 2017/0077802 A1 Mar. 16, 2017

(30) Foreign Application Priority Data
May 16, 2014 (CN) .......................... 2014 1 0210175

(51) Int. Cl.
*G05F 1/00* (2006.01)
*H02M 3/156* (2006.01)
(Continued)

(52) U.S. Cl.
CPC ............. *H02M 3/156* (2013.01); *H02M 1/44* (2013.01); *H02M 3/04* (2013.01)

(58) Field of Classification Search
CPC ................. H02M 3/156; H02M 3/158; H02M 2003/1586; H02M 2003/1566; H02M 3/1563; H02M 3/1582
(Continued)

(56) References Cited

U.S. PATENT DOCUMENTS 7,170,264 B1 1/2007 Galinski
7,492,132 B2 * 2/2009 Kuroiwa ............... H02M 3/156
323/222
(Continued)

FOREIGN PATENT DOCUMENTS

CN 1988378 A 6/2007
CN 101063890 A 10/2007
(Continued)

OTHER PUBLICATIONS

International Search Report for Application No. PCT/CN2014/087132, dated Jan. 4, 2015.

*Primary Examiner* — Nguyen Tran
(74) *Attorney, Agent, or Firm* — Marshall, Gerstein & Borun LLP

(57) ABSTRACT

Disclosed are a compensation network, switching power supply circuit and a circuit compensation method; in the compensation network: an output end of the resistance capacitance network is cascaded to an input end of the unity gain amplifier network, and an output end of the unity gain amplifier network is cascaded to an input end of the error amplifier network; the resistance capacitance network is configured to provide a voltage dividing resistor, and generate a zero and a pole which are mutually canceled; the unity gain amplifier network is configured to generate a zero for canceling a pole in a low pass filter network, and a pole for suppressing a high-frequency noise and improving a phase margin of a switching power supply circuit; and the error amplifier network is configured to generate a pole for
(Continued)

increasing low-frequency gain and a zero for canceling another pole in the low pass filter network.

19 Claims, 2 Drawing Sheets

(51) Int. Cl.
    *H02M 3/04*       (2006.01)
    *H02M 1/44*       (2007.01)

(58) Field of Classification Search
    USPC .................................. 323/222, 271, 282–285
    See application file for complete search history.

(56) References Cited

U.S. PATENT DOCUMENTS

| | | | |
|---|---|---|---|
| 2005/0007089 A1* | 1/2005 | Niiyama | H02M 3/1582 323/284 |
| 2008/0284395 A1 | 11/2008 | Wang et al. | |
| 2014/0361756 A1* | 12/2014 | Wang | H02M 3/156 323/282 |

FOREIGN PATENT DOCUMENTS

| | | |
|---|---|---|
| CN | 101126937 A | 2/2008 |
| CN | 101459381 A | 6/2009 |
| CN | 101478234 A | 7/2009 |
| CN | 101694962 A | 4/2010 |

* cited by examiner

--Prior Art--

--Prior Art--

COMPENSATION NETWORK, SWITCHING POWER SUPPLY CIRCUIT AND CIRCUIT COMPENSATION METHOD

TECHNICAL FIELD

The present disclosure relates to the field of microelectronic technologies, and particularly to a compensation network, a switching power supply circuit and a circuit compensation method.

BACKGROUND

Power supply technology belongs to a category of power electronic technology, and is an edge cross subject integrating many disciplines, such as power conversion, modern electronics and automatic control, and has been widely applied in various fields nowadays, such as industry, energy sources, traffic, IT, aeronautics, national defense, education, and culture. In fact, development of the power supply technology is concentrated on diligent studies conducted for improving an efficiency and a performance, reducing in size and weight, being safe and reliable, eliminating power public nuisance, and reducing electromagnetic interference and traces of electric noise, a switching power supply is a crucial part in the whole power supply technology, where, a compensation network of a Pulse Width Modulation (PWM) power supply regulator is an important research subject of the switching power supply.

Generally, a switching power supply circuit is composed of three basic modules, as shown in FIG. 1, which include: a power switching regulator 11, a low pass filter network 12 and a compensation network 13. The power switching regulator 11 is configured to generate a square wave signal, to control an ON/OFF state of a power tube; the low pass filter network 12, i.e., an LC network, is configured to filter an output voltage and current, to generate an LC double pole; the compensation network 13 is composed of a voltage sampling circuit, an error amplifier and a compensation circuit element.

An error amplifier is often used in design of a switching power supply circuit, if a low-frequency gain desired by the switching power supply circuit is very high, there is a need to compensate the error amplifier in the compensation network, so as to guarantee that the switching power supply circuit has a great bandwidth and a good phase margin. A high low-frequency gain is required by the switching power supply circuit in a voltage mode, but a power-stage transfer function has a low low-frequency gain, and there is a pair of LC conjugated poles, therefore there is a need to add an error amplifier to obtain a high low-frequency gain and meanwhile compensate the error amplifier to eliminate influence of the conjugated poles, so as to make the switching power supply circuit have a high phase margin at the same time of obtaining a great bandwidth.

As shown in FIG. 2, a conventional compensation network adopts a solution that two ends of an error amplifier AMP0 are bridged with resistance capacitance networks, and the compensation network composed of resistors R6, R7, R8 and capacitors C5, C6, C7 just can compensate three poles and two zeros in the original switching power supply circuit. The switching power supply circuit obtained in such way can obtain a high bandwidth and phase margin at a low frequency, have a small gain at a switching frequency, and thus have a good suppression effect on switching noises. However, when a switching frequency required by the switching power supply circuit is high, stability of the switching power supply circuit cannot be guaranteed any more due to a pole effect of the error amplifier itself. Additionally, a pole would also be introduced when an input end of the error amplifier needs to be connected with a voltage dividing resistor, which has a great effect on compensation.

SUMMARY

In order to solve the problem in the prior art, embodiments of the present invention provide a compensation network, a switching power supply circuit and a circuit compensation method.

Embodiments of the present invention provide a compensation network, including: a resistance capacitance network, a unity gain amplifier network and an error amplifier network; where, an output end of the resistance capacitance network is cascaded to an input end of the unity gain amplifier network, and an output end of the unity gain amplifier network is cascaded to an input end of the error amplifier network;

the resistance capacitance network is configured to provide a voltage dividing resistor, and generate a zero and a pole which are mutually canceled;

the unity gain amplifier network is configured to generate a zero for canceling a pole in a low pass filter network, and a pole for suppressing a high-frequency noise and improving a phase margin of a switching power supply circuit; and the error amplifier network is configured to generate a pole for increasing low-frequency gain and a zero for canceling another pole in the low pass filter network.

In the above solutions, the resistance capacitance network includes: a first resistor, a second resistor, a first capacitor and a second capacitor; where, the first resistor is connected in series between a first input end and a first output end, the second capacitor is connected between two ends of the first resistor, the first capacitor is connected between the first input end and the ground, and the second resistor is connected between the first output end and the ground.

In the above solutions, the unity gain amplifier network includes: a first amplifier, a third resistor, a fourth resistor and a third capacitor; where, the third resistor is connected between an inverting input end and an output end of the first amplifier; the fourth resistor and the third capacitor is connected between the inverting input end of the first amplifier and the ground; a positive input end of the first amplifier is connected to the first output end of the resistance capacitance network.

In the above solutions, the error amplifier network includes: a second amplifier, a fifth resistor and a fourth capacitor; where, the fifth resistor and the fourth capacitor is connected between an output end of the second amplifier and the ground; a positive input end of the second amplifier is connected to an output end of the unity gain amplifier network.

In the above solutions, the second capacitor is a variable capacitor, and the first resistor and the second resistor are variable resistors.

In the above solutions, the third capacitor is a variable capacitor, and the third resistor and the fourth resistor are variable resistors.

In the above solutions, the fourth capacitor is a variable capacitor, and the fifth resistor is a variable resistor.

In the above solutions, a capacitance value of the fourth capacitor is far greater than an equivalent capacitance value of the second amplifier.

Embodiments of the present invention provide a switching power supply circuit, including the compensation network described above.

Embodiments of the present invention provide a circuit compensation method, including: a resistance capacitance network provides a voltage dividing resistor and generates a zero and a pole which are mutually canceled; a unity gain amplifier network generates a zero for canceling a pole in a low pass filter network, and a pole for suppressing a high-frequency noise and improving a phase margin of a switching power supply circuit; and an error amplifier network generates a pole for increasing low-frequency gain and a zero for canceling another pole in the low pass filter network.

The compensation network provided by embodiments of the present invention includes: a resistance capacitance network, a unity gain amplifier network and an error amplifier network; where, an output end of the resistance capacitance network is cascaded to an input end of the unity gain amplifier network, and an output end of the unity gain amplifier network is cascaded to an input end of the error amplifier network; the resistance capacitance network is configured to provide a voltage dividing resistor, and generate a zero and a pole which are mutually canceled; the unity gain amplifier network is configured to isolate a dividing resistor and the error amplifier network, transfer a voltage change in an input end to an output end of the error amplifier network, generate a zero for canceling a pole in a low pass filter network, and a pole for suppressing a high-frequency noise and improving a phase margin of a switching power supply circuit; and the error amplifier network is configured to output the amplified voltage change, and generate a pole for increasing low-frequency gain and a zero for canceling another pole in the low pass filter network. As such, when the switching frequency required by a system is very high, the effect of the pole of the error amplifier itself on compensation effect can be suppressed; moreover, when an input end of the error amplifier needs to be connected to a voltage dividing resistor, the effect of the pole on compensation effect due to the voltage dividing resistor can be suppressed; so that the low-frequency gain of the switching power supply circuit is improved, a stability problem of the switching power supply circuit in a high-frequency voltage mode is solved, the switching power supply circuit can have a good phase margin at the same time of obtaining a very high bandwidth.

BRIEF DESCRIPTION OF DRAWINGS

In various drawings, which are not necessarily to scale, like reference symbols can describe like components Like reference symbols with different letter suffixes can indicate different examples of like components. The drawings generally illustrate each embodiment discussed here by way of explanation, not limitation.

DETAILED DESCRIPTION

Embodiments of the present invention provide a compensation network, including: a resistance capacitance network, a unity gain amplifier network and an error amplifier network; where an output end of the resistance capacitance network is cascaded to an input end of the unity gain amplifier network, and an output end of the unity gain amplifier network is cascaded to an input end of the error amplifier network; the resistance capacitance network is configured to provide a voltage dividing resistor, and generate a zero and a pole which are mutually canceled; the unity gain amplifier network is configured to generate a zero for canceling a pole in a low pass filter network, and a pole for suppressing a high-frequency noise and improving a phase margin of a switching power supply circuit; the error amplifier network is configured to generate a pole for increasing low-frequency gain and a zero for canceling another pole in the low pass filter network.

The present disclosure will be further described in detail with reference to the accompanying drawings in combination with the detailed embodiments.

Figure 1:
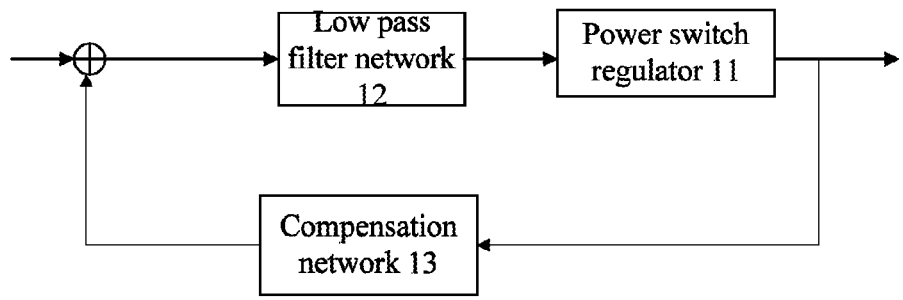
FIG. 1 is a basic structural block diagram illustrating a switching power supply circuit in the prior art.
Figure 2:
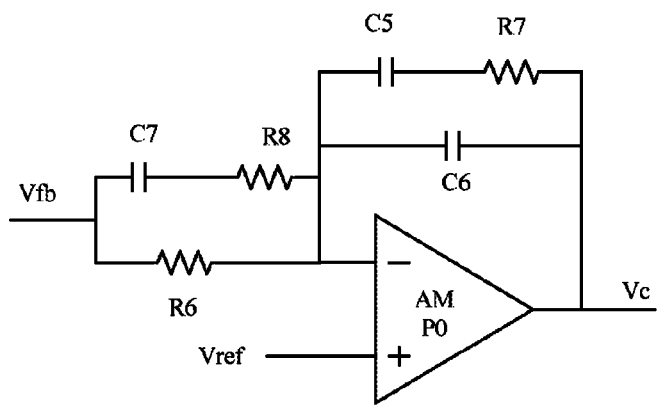
FIG. 2 is a basic structural diagram illustrating a compensation network in the prior art.
Figure 3:
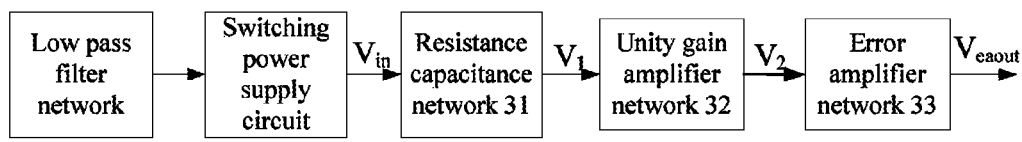
FIG. 3 is a schematic structural diagram illustrating a compensation network according to at least one embodiment of the present invention.

Embodiments of the present invention provide a compensation network, FIG. 3 is a schematic structural diagram illustrating the compensation network, as shown in FIG. 3, the compensation network is composed of three-stage compensation networks, which respectively are: a resistance capacitance network 31, a unity gain amplifier network 32 and an error amplifier network 33; an output end of the resistance capacitance network 31 is cascaded to an input end of the unity gain amplifier network 32, and an output end of the unity gain amplifier network 32 is cascaded to an input end of the error amplifier network 33; therefore, a voltage $V_1$ is output after an output voltage $V_{in}$ of the switching power supply is input into the resistance capacitance network 31, a voltage $V_2$ is output after the voltage $V_1$ is input into the unity gain amplifier network 32, and an output voltage $V_{eaout}$ is generated after the voltage $V_2$ enters the error amplifier network 33; where, the resistance capacitance network 31 is configured to provide a voltage dividing resistor, and generate a zero and a pole which are mutually canceled; the unity gain amplifier network 32 is configured to isolate the dividing resistor and the error amplifier network 33, transfer a voltage change in an input end to an output end of the error amplifier network 33, generate a zero for canceling a pole in a low pass filter network, and a pole for suppressing a high-frequency noise and improving a phase margin of a switching power supply circuit; the error amplifier network 33 is configured to output the amplified voltage change, and generate a pole for increasing low-frequency gain and a zero for canceling another pole in the low pass filter network; and in practical applications, the error amplifier network 33 may output the amplified change to a PWM modulator, and meanwhile reduce the gain at a higher frequency, so as to achieve the purpose of suppressing noises.

Figure 4:
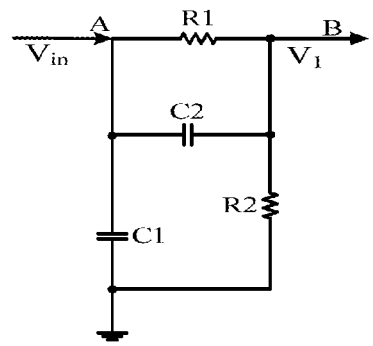
FIG. 4 is a basic schematic structural diagram illustrating a resistance capacitance network in a compensation network according to at least one embodiment of the present invention.

FIG. 4 is a basic schematic structural diagram illustrating a resistance capacitance network in a compensation network according to an embodiment of the present invention, as shown in FIG. 4, the resistance capacitance network is composed of a first resistor R1, a second resistor R2, a first capacitor C1 and a second capacitor C2; the first resistor R1 and the second resistor R2 are voltage dividing resistors; the first resistor R1 is connected in series between a first input end A and a first output end B, the second capacitor C2 is connected between two ends of the first resistor R1; the C1 is connected between the first input end A and the ground, so as to stable input; the second resistor R2 is connected between the first output end B and the ground; it should be noted that, the first resistor R1 and the second resistor R2 may be variable resistors, the first capacitor C1 and the second capacitor C2 may be variable capacitors; assuming that the output voltage $V_{in}$ of the switching power supply circuit is input after sampling or directly from the first input end A of the resistance capacitance network, then the voltage $V_1$ is output from the first output end B via the resistance capacitance network, then a transfer function from $V_{in}$ to $V_1$ is:

$$\frac{V_1}{V_{in}} = \frac{R_1 C_2 s + 1}{(R_1 // R_2) C_2 s + 1};$$

From the above equation, a zero $\omega_{z1}$ and a pole $\omega_{p1}$ may be respectively obtained as:

$$\omega_{z1} = \frac{1}{R_1 C_2}, \omega_{p1} = \frac{1}{(R_1 // R_2) C_2};$$

It can be seen that, a zero and a pole are introduced when the resistance capacitance network provides the voltage dividing resistor for the compensation network, as such, the zero and the pole are mutually canceled, which will not affect the compensation network, unlike in the prior art that one pole is introduced when an input end of the error amplifier is connected to a voltage dividing resistor, which affects compensation effect to the compensation network.

Figure 5:
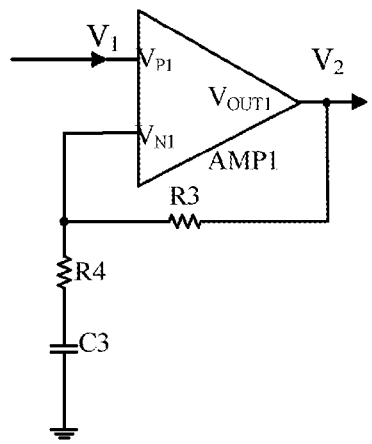
FIG. 5 is a basic schematic structural diagram illustrating a unity gain amplifier network in a compensation network according to at least one embodiment of the present invention.

FIG. 5 is a basic schematic structural diagram illustrating a unity gain amplifier network in a compensation network according to an embodiment of the present invention, as shown in FIG. 5, the unity gain amplifier network is composed of a first amplifier AMP1, a third resistor R3, a fourth resistor R4 and a third capacitor C3; an inverting input end $V_{N1}$ and an output end $V_{OUT1}$ of the first amplifier AMP1 are connected with each other via the third resistor R3; the fourth resistor R4 and the third capacitor C3 are connected in series between the ground and a connecting point of the inverting input end $V_{N1}$ and the third resistor R3; it should be noted that, the third resistor R3 and the fourth resistor R4 may be variable resistors, and the third capacitor C3 may be a variable capacitor; in a case of a low frequency, the third capacitor C3 is equivalent to an open circuit, resistance between the inverting input end $V_{N1}$ and the ground is infinite, the third resistor R3 may be considered as a guide wire, then the amplifier AMP1 acts as a unity gain amplifier to transfer a change of the $V_1$ to the $V_2$; as the frequency increases, an equivalent impedance of the third capacitor C3 reduces constantly, when the impedance is reduced to be equivalent to the third resistor R3, at this time, the unity gain amplifier network is merely equivalent to an amplifier; as the frequency further increases, the equivalent impedance of the third capacitor C3 further reduces, and finally is far less than the third capacitor C3, then a role of the first amplifier AMP1 is to amplify a voltage change input from a positive input end $V_{P1}$ of the first amplifier AMP1 by 1+R3/R4 times; as shown in FIG. 5, the output voltage $V_1$ of the resistance capacitance network enters the positive input end $V_{P1}$ of the amplifier, and the $V_2$ is output, then a transfer function from $V_1$ to $V_2$ is:

$$\frac{V2}{V1} = \frac{(R_3 + R_4)C_3 s + 1}{R_4 C_3 s + 1}$$

As such, the transfer function has a zero $\omega_{z2}$ and a pole $\omega_{p2}$:

$$\omega_{z2} = \frac{1}{(R_3 + R_4)C_3},$$

$$\omega_{p2} = \frac{1}{R_4 C_3};$$

The unity gain amplifier network in this stage generates a zero and a pole, the zero just can be used for canceling one of the pair of conjugated poles introduced from the low pass filter network in the switching power supply circuit; the pole can suppress the effect of the pole of the error amplifier network itself on compensation effect at a high frequency.

Figure 6:
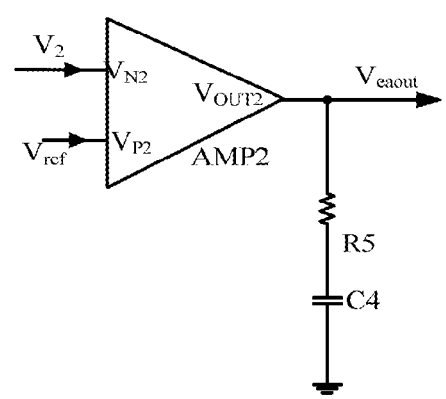
FIG. 6 is a basic schematic structural diagram illustrating an error amplifier network in a compensation network according to at least one embodiment of the present invention.

FIG. 6 is a basic schematic structural diagram illustrating an error amplifier network in a compensation network according to an embodiment of the present invention, as shown in FIG. 6, the error amplifier network is composed of a second amplifier AMP2, a fifth resistor R5 and a fourth capacitor C4; the fifth resistor R5 and the fourth capacitor C4 is connected in series between an output end of the second amplifier AMP2 and the ground; the positive input end $V_{P2}$ of the second amplifier AMP2 is connected to a reference voltage $V_{ref}$; it should be noted that, the fifth resistor R5 may be a variable resistor, and the fourth capacitor C4 may be a variable capacitor;

After the voltage $V_2$ output from the unity gain amplifier network passes through the error amplifier network circuit, the voltage $V_{eaout}$ is output from an output end $V_{OUT2}$ of the error amplifier network. Assuming that a transconductance of the second amplifier AMP2 is gm, an equivalent output resistance of the second amplifier AMP2 is $R_{out}$, an equivalent output capacitance of the second amplifier AMP2 is $C_{out}$, then a transfer function from the $V_2$ to the $V_{eaout}$ is:

$$\frac{V_{eaout}}{V_2} = g_m R_{out} \frac{R_5 C_4 s + 1}{R_5 R_{out} C_4 C_{out} s^2 + (R_5 C_4 + R_{out} C_{out} + R_{out} C_4) s + 1},$$

and there is a zero $\omega_{z3}$ in the above transfer function:

$$\omega_{z3} = \frac{1}{R_5 C_4},$$

If the compensation network satisfies $C_4 \gg C_{out}$, then there are two poles of $\omega_{p0}$ and $\omega_{p3}$ in the transfer function:

$$\omega_{p0} = \frac{1}{R_{out} C_4},$$

$$\omega_{p3} = \frac{1}{(R_5 // R_{out})C_{out}};$$

One zero and two poles are generated in the error amplifier network of this stage, the zero and the other one of the pair of LC conjugated poles introduced from the low pass filter network in the existing switching power supply circuit can cancel each other; $\omega_{p0}$ in the two poles generated here is a dominant pole in the compensation network provided in embodiments of the present invention, the dominant pole can be used for making the switching power supply circuit achieve a high low-frequency gain under low frequency, so as to guarantee that the switching power supply circuit has a great bandwidth and a good phase margin.

In this example, since the pole $\omega_{P1}$ and the zero $\omega_{z1}$ in the first-stage resistance capacitance network cancel each other, thus having no distinct influence on overall compensation effect; however, at the same time of providing a voltage dividing function, not only a gain of the overall compensation network in a mid-frequency band is improved, but also a certain phase can be provided, so that it is very easy to improve the phase margin of the overall switching power supply circuit; a zero $\omega_{z2}$ and a pole $\omega_{p2}$ provided by a second-stage unity gain amplifier network are the zero and the pole required by the compensation network, where, the $\omega_{z2}$ is used for canceling one pole formed by the low pass filter network, while the $\omega_{p2}$ is provided near the switching frequency for suppressing a high-frequency noise on one hand, and improving a phase margin of the switching power supply circuit on the other hand; it can be seen from the transfer function of the second-stage unity gain amplifier network that, once a capacitance value of the second capacitor C2 is determined, relative positions of the zero $\omega_{z2}$ and the pole $\omega_{p2}$ can be adjusted according to a compensation request only by adjusting relative resistance values of the third resistor R3 and the fourth resistor R4; a third-stage error amplifier network provides the dominant pole $\omega_{p0}$ of the compensation network. When the pole and the zero are compensated, an output resistance and output capacitance of the error amplifier itself has been considered, and the pole of the error amplifier itself has also been taken into consideration in the design, as such, positions of the zero and the pole can be adjusted by adjusting the resistance value of the fifth resistor R5 and the capacitance value of the third capacitor C3, and the pole of the error amplifier itself would not influence stability of the circuit. The dominant pole $\omega_{p0}$ is closest to an origin, which is favorable to improve the low-frequency gain; the zero $\omega_{z3}$ is used for canceling another pole formed in a low pass filter network, and the pole $\omega_{p3}$, like the $\omega_{p2}$, is provided near the switching frequency, and is also used for suppressing noises of a switching frequency and improving a phase margin. When viewed from distribution positions of all the zeros and poles, before the dominant pole and near the origin, the gain of the compensation network is a gain product of three stages of circuits, and a phase is 180°; starting from a position of the dominant pole, the gain drops gradually, a change in the position of the dominant pole would cause the phase to drop by 90° or so; positions of the two zeros $\omega_{z2}$, $\omega_{z3}$ are very close, and before poles $\omega_{p2}$, $\omega_{p3}$, the gain of the compensation network starts to rise by 1-time frequency interval after the two zeros, and the phase would also rise with a potential of 180°; positions of poles $\omega_{p2}$, $\omega_{p3}$ are very close, and the gain starts to drop after the two poles, so as to guarantee the gain at the switching frequency is small enough; as such, there would be a very high phase between the zero and the pole; and if the phase is not enough, values of the first capacitor C1, the first resistor R1 and the second resistor R2 in the resistance capacitance network can be adjusted, so as to adjust specific positions of the pair of the zero $\omega_{z1}$ and the pole $\omega_{p1}$, and improve a phases between poles $\omega_{p2}$, $\omega_{p3}$ and zeros $\omega_{z2}$, $\omega_{z3}$ of the switching power supply circuit; it is very convenient and flexible to adjust, and very easy to obtain a condition satisfying stability and a high bandwidth in the whole switching power supply circuit; additionally, if an input capacitance has an equivalent series resistance (ESR), one of the poles $\omega_{p2}$ or $\omega_{p3}$ also can be utilized to cancel a zero generated due to the ESR.

The amplifiers AMP1, AMP2 in embodiments of the present invention can be selected from various types of operational amplifiers according to actual requirements, such as a push-pull output transconductance operational amplifier.

Embodiments of the present invention further provide a circuit compensation method, including: a resistance capacitance network provides a voltage dividing resistor and generates a zero and a pole which are mutually canceled; a unity gain amplifier network generates a zero for canceling a pole in a low pass filter network, and a pole for suppressing a high-frequency noise and improving a phase margin of a switching power supply circuit; and an error amplifier network generates a pole for increasing low-frequency gain and a zero for canceling another pole in the low pass filter network.

Embodiments of the present invention further provide a switching power supply circuit, and a compensation network of the switching power supply circuit adopts the compensation network provided in embodiments of the present invention.

The above descriptions are merely embodiments of the present invention, but are not intended to limit the protection scope of the present disclosure.

What is claimed is:

1. A compensation network, comprising: a resistance capacitance network, a unity gain amplifier network and an error amplifier network; wherein,
    an output end of the resistance capacitance network is cascaded to an input end of the unity gain amplifier network, and an output end of the unity gain amplifier network is cascaded to an input end of the error amplifier network;
    the resistance capacitance network is configured to provide a voltage dividing resistor, and generate a zero and a pole which are mutually canceled;
    the unity gain amplifier network is configured to generate a zero for canceling a pole in a low pass filter network, and a pole for suppressing a high-frequency noise and improving a phase margin of a switching power supply circuit; and
    the error amplifier network is configured to generate a pole for increasing low-frequency gain and a zero for canceling another pole in the low pass filter network.

2. The compensation network according to claim 1, wherein, the resistance capacitance network comprises: a first resistor, a second resistor, a first capacitor and a second capacitor; wherein, the first resistor is connected in series between a first input end and a first output end, the second capacitor is connected between two ends of the first resistor, the first capacitor is connected between the first input end and the ground, and the second resistor is connected between the first output end and the ground.

3. The compensation network according to claim 1, wherein, the unity gain amplifier network comprises: a first amplifier, a third resistor, a fourth resistor and a third capacitor; wherein, the third resistor is connected between an inverting input end and an output end of the first amplifier; the fourth resistor and the third capacitor is connected between the inverting input end of the first amplifier and the ground; a positive input end of the first amplifier is connected to the first output end of the resistance capacitance network.

4. The compensation network according to claim 1, wherein, the error amplifier network comprises: a second amplifier, a fifth resistor and a fourth capacitor; wherein, the fifth resistor and the fourth capacitor is connected between an output end of the second amplifier and the ground; a positive input end of the second amplifier is connected to an output end of the unity gain amplifier network.

5. The compensation network according to claim 2, wherein, the second capacitor is a variable capacitor, and the first resistor and the second resistor are variable resistors.

6. The compensation network according to claim 3, wherein, the third capacitor is a variable capacitor, and the third resistor and the fourth resistor are variable resistors.

7. The compensation network according to claim 4, wherein, the fourth capacitor is a variable capacitor, and the fifth resistor is a variable resistor.

8. The compensation network according to claim 4, wherein, a capacitance value of the fourth capacitor is far greater than an equivalent capacitance value of the second amplifier.

9. A switching power supply circuit, comprising a compensation network, comprising: a resistance capacitance network, a unity gain amplifier network and an error amplifier network; wherein,
an output end of the resistance capacitance network is cascaded to an input end of the unity gain amplifier network, and an output end of the unity gain amplifier network is cascaded to an input end of the error amplifier network;
the resistance capacitance network is configured to provide a voltage dividing resistor, and generate a zero and a pole which are mutually canceled;
the unity gain amplifier network is configured to generate a zero for canceling a pole in a low pass filter network, and a pole for suppressing a high-frequency noise and improving a phase margin of a switching power supply circuit; and
the error amplifier network is configured to generate a pole for increasing low-frequency gain and a zero for canceling another pole in the low pass filter network.

10. A circuit compensation method, comprising: a resistance capacitance network provides a voltage dividing resistor and generates a zero and a pole which are mutually canceled; a unity gain amplifier network generates a zero for canceling a pole in a low pass filter network, and a pole for suppressing a high-frequency noise and improving a phase margin of a switching power supply circuit; and an error amplifier network generates a pole for increasing low-frequency gain and a zero for canceling another pole in the low pass filter network.

11. The compensation network according to claim 7, wherein, a capacitance value of the fourth capacitor is far greater than an equivalent capacitance value of the second amplifier.

12. The switching power supply circuit according to claim 9, wherein, the resistance capacitance network comprises: a first resistor, a second resistor, a first capacitor and a second capacitor; wherein, the first resistor is connected in series between a first input end and a first output end, the second capacitor is connected between two ends of the first resistor, the first capacitor is connected between the first input end and the ground, and the second resistor is connected between the first output end and the ground.

13. The switching power supply circuit according to claim 9, wherein, the unity gain amplifier network comprises: a first amplifier, a third resistor, a fourth resistor and a third capacitor; wherein, the third resistor is connected between an inverting input end and an output end of the first amplifier; the fourth resistor and the third capacitor is connected between the inverting input end of the first amplifier and the ground; a positive input end of the first amplifier is connected to the first output end of the resistance capacitance network.

14. The switching power supply circuit according to claim 9, wherein, the error amplifier network comprises: a second amplifier, a fifth resistor and a fourth capacitor; wherein, the fifth resistor and the fourth capacitor is connected between an output end of the second amplifier and the ground; a positive input end of the second amplifier is connected to an output end of the unity gain amplifier network.

15. The switching power supply circuit according to claim 12, wherein, the second capacitor is a variable capacitor, and the first resistor and the second resistor are variable resistors.

16. The switching power supply circuit according to claim 13, wherein, the third capacitor is a variable capacitor, and the third resistor and the fourth resistor are variable resistors.

17. The switching power supply circuit according to claim 14, wherein, the fourth capacitor is a variable capacitor, and the fifth resistor is a variable resistor.

18. The switching power supply circuit according to claim 14, wherein, a capacitance value of the fourth capacitor is far greater than an equivalent capacitance value of the second amplifier.

19. The switching power supply circuit according to claim 17, wherein, a capacitance value of the fourth capacitor is far greater than an equivalent capacitance value of the second amplifier.

* * * * *